(12) United States Patent
Sathe et al.

(10) Patent No.: US 8,854,100 B2
(45) Date of Patent: Oct. 7, 2014

(54) CLOCK DRIVER FOR FREQUENCY-SCALABLE SYSTEMS

(75) Inventors: Visvesh S. Sathe, Fort Collins, CO (US); Samuel D. Naffziger, Fort Collins, CO (US); Srikanth Arekapudi, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 13/601,188

(22) Filed: Aug. 31, 2012

(65) Prior Publication Data

US 2014/0062565 A1   Mar. 6, 2014

(51) Int. Cl.
G06F 1/04 (2006.01)
H03K 3/00 (2006.01)
H03K 19/003 (2006.01)

(52) U.S. Cl.
CPC .................................. *H03K 19/003* (2013.01)
USPC .............. 327/291; 327/293; 327/298; 326/83

(58) Field of Classification Search
CPC ............................................... H03K 19/00315
USPC .............................. 327/291, 292, 295; 326/83
See application file for complete search history.

(56) References Cited

U.S. PATENT DOCUMENTS

| | | | |
|---|---|---|---|
| 6,025,738 A * | 2/2000 | Masleid | 326/83 |
| 6,205,571 B1 | 3/2001 | Camporese et al. | |
| 6,310,499 B1 * | 10/2001 | Radjassamy | 327/175 |
| 7,082,580 B2 | 7/2006 | Zarkesh-Ha et al. | |
| 7,084,685 B2 | 8/2006 | Lin et al. | |
| 7,237,217 B2 | 6/2007 | Restle | |
| 7,702,944 B2 | 4/2010 | Chelstrom et al. | |
| 8,339,209 B2 | 12/2012 | Papaefthymiou et al. | |
| 8,362,811 B2 | 1/2013 | Papaefthymiou et al. | |
| 8,368,450 B2 | 2/2013 | Papaefthymiou et al. | |
| 8,400,192 B2 | 3/2013 | Papaefthymiou et al. | |
| 8,502,569 B2 | 8/2013 | Papaefthymiou et al. | |
| 2005/0057286 A1 | 3/2005 | Shepard et al. | |
| 2008/0303576 A1 | 12/2008 | Chueh et al. | |
| 2009/0027085 A1 | 1/2009 | Ishii et al. | |
| 2011/0084736 A1 | 4/2011 | Papaefthymiou et al. | |
| 2011/0084772 A1 | 4/2011 | Papaefthymiou et al. | |
| 2011/0084773 A1 | 4/2011 | Papaefthymiou et al. | |
| 2011/0084774 A1 | 4/2011 | Papaefthymiou et al. | |
| 2011/0084775 A1 | 4/2011 | Papaefthymiou et al. | |

(Continued)

OTHER PUBLICATIONS

U.S. Appl. No. 13/601,138, filed Aug. 31, 2012, entitled "Transitioning from Resonant Clocking Mode to Conventional Clocking Mode," naming inventors Visvesh S. Sathe and Samuel Naffziger.

(Continued)

*Primary Examiner* — John Poos
(74) *Attorney, Agent, or Firm* — Abel Law Group, LLP

(57) ABSTRACT

A clock driver for a resonant clock network includes a delay circuit that receives and supplies a delayed clock signal. A first transistor is coupled to receive a first pulse control signal and supply an output clock node of the clock driver. An asserted edge of the first control signal is responsive to the falling edge of the delayed clock signal. A second transistor is coupled to receive a second control signal and to supply the output clock node of the clock driver. An asserted edge of the second control signal is responsive to a rising edge of the delayed clock signal.

19 Claims, 4 Drawing Sheets

(56) References Cited

U.S. PATENT DOCUMENTS

| | | |
|---|---|---|
| 2011/0090018 A1 | 4/2011 | Papaefthymiou et al. |
| 2011/0090019 A1 | 4/2011 | Papaefthymiou et al. |
| 2011/0140753 A1 | 6/2011 | Papaefthymiou et al. |
| 2013/0049824 A1 | 2/2013 | Kim et al. |
| 2013/0154727 A1 | 6/2013 | Guthaus |
| 2013/0194018 A1 | 8/2013 | Papaefthymiou et al. |

OTHER PUBLICATIONS

U.S. Appl. No. 13/601,175, filed Aug. 31, 2012, entitled "Programmable Clock Driver," naming inventors Visvesh S. Sathe et al.

U.S. Appl. No. 13/601,155, filed Aug. 31, 2012, entitled "Controlling Impedance of a Switch Using High Impedance Voltage Sources to Provide Sources to Provide More Efficient Clocking," naming inventors Visvesh S. Sathe and Samuel Naffziger.

U.S. Appl. No. 13/601,119, filed Aug. 31, 2012, entitled "Constraining Clock Skew in a Resonant Clocked System," naming inventors Visvesh S. Sathe and Samuel Naffziger.

Non-final Office action in U.S. Appl. No. 13/601,155, dated Aug. 9, 2013, 15 pages.

Non-final Office action in U.S. Appl. No. 13/601,119, dated Nov. 13, 2013, 16 pages.

Non-final Office action in U.S. Appl. No. 13/601,138, dated May 28, 2013, 26 pages.

Non-final Office action in U.S. Appl. No. 13/601,175, dated Aug. 1, 2013, 15 pages.

\* cited by examiner

US 8,854,100 B2

CLOCK DRIVER FOR FREQUENCY-SCALABLE SYSTEMS

BACKGROUND

1. Technical Field

The disclosed embodiments relate to clocking in integrated circuits and more particularly to pulse drive systems for clock drivers.

2. Description of the Related Art

Clock distribution networks account for a significant portion of overall power consumption in most high performance digital circuits today due to the large parasitic capacitance that is connected to the clock network. One aspect of efficient clock distribution is to ensure efficiency in various aspects of the clock system.

SUMMARY OF EMBODIMENTS

In some embodiments, an apparatus includes a delay circuit coupled to receive a clock signal and supply a delayed clock signal. A first transistor is coupled to receive a first pulse control signal and supply an output clock node to generate an output clock signal based in part on the first pulse control signal. An asserted edge of the first control signal is responsive to a falling edge of the delayed clock signal. A second transistor is coupled to receive a second control signal and to supply the output clock node to generate the output clock signal based in part on the second pulse control signal. An asserted edge of the second control signal is responsive to a rising edge of the delayed clock signal.

In another embodiment, a method includes delaying a clock signal in a delay circuit supplying a delayed clock signal, asserting a first pulse control signal responsive to a falling edge of the delayed clock signal, supplying the first pulse control signal to a first transistor as a first gate signal, asserting a second pulse control signal responsive to a rising edge of the delayed clock signal, and supplying the second pulse control signal to the second first transistor as a second gate signal.

In another embodiment, a non-transitory computer-readable medium stores a computer readable data structure encoding a functional description of an integrated circuit. The integrated circuit includes a resonant clock network, a delay circuit coupled to receive a clock signal and supply a delayed clock signal, a first transistor coupled to receive a first pulse control signal as a first gate signal and supply an output clock node, wherein an asserted edge of the first control signal is responsive to a falling edge of the delayed clock signal. A second transistor is coupled to receive a second control signal as a second gate signal and to supply the output clock node, wherein an asserted edge of the second control signal is responsive to a rising edge of the delayed clock signal. A first current carrying terminal of the first transistor is coupled to a first power supply and a second current carrying terminal of the first transistor is coupled to a clock output signal node. A first carrying terminal of the second transistor is coupled to a second power supply and a second current carrying terminal of the second transistor is coupled to the clock output signal node.

BRIEF DESCRIPTION OF THE DRAWINGS

The embodiments disclosed herein may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
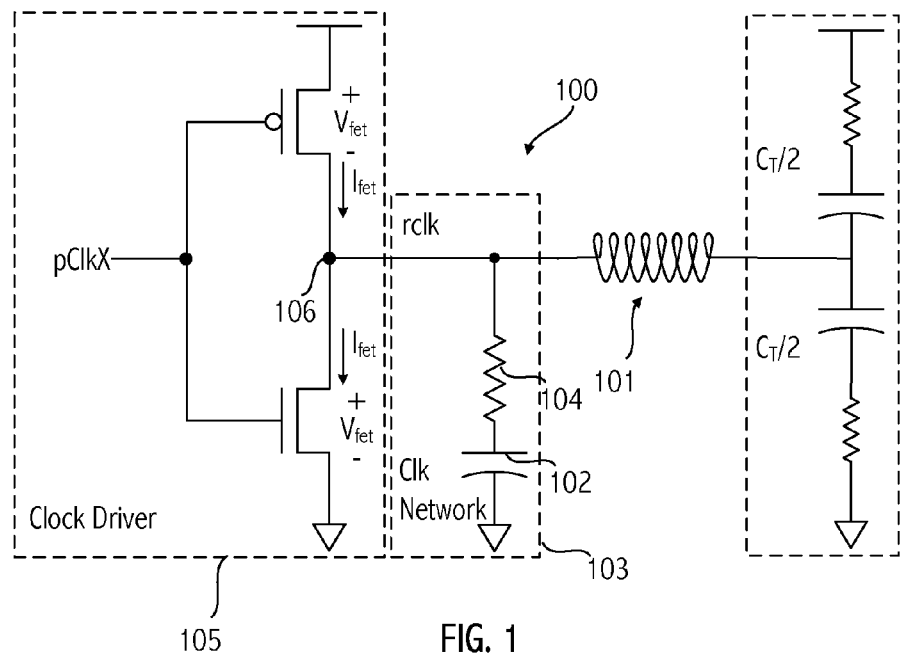
FIG. 1 illustrates a simplified model of a resonant clock network, according to some embodiments.

One promising technique to implement more energy-efficient clock distribution is the use of resonant clocking. FIG. 1 illustrates a simplified model of a resonant clock system 100, according to some embodiments. A distinct feature of the resonant clock system 100 is the use of an inductance (L) 101 that is connected in parallel with the parasitic network capacitance 102 of clock network 103. In contrast with a conventional clock network, where all the charge, and therefore energy per cycle, is provided by the power supply, the approach illustrated in FIG. 1 uses LC resonance between the parasitic network capacitance 102 and the inductance (L) 101 to enable efficient energy transfer between these two components. The role of the clock driver is to replenish only the energy lost in the parasitic resistance 104 of the LC system. For an ideal inductor and interconnect, with no parasitic resistance, the clock network would oscillate with zero energy dissipation.

Figure 2:
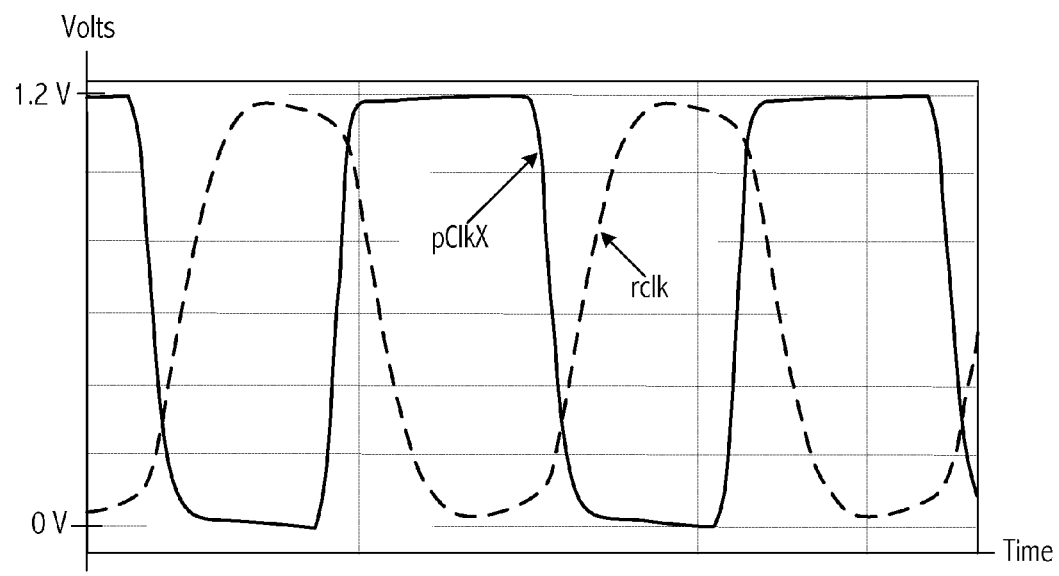
FIG. 2 illustrates the waveforms associated with the clock driver of FIG. 1, according to some embodiments.

The energy losses in the resonant clock network of FIG. 1 occur in the resistance of the inductor 101, the resistance 104 of the clock network 103, as well as the resistance of the clock driver 105. FIG. 2 shows the waveforms associated with the clock driver control signal pClkX and the output clock signal rclk at node 106 of FIG. 1. The losses across the conducting transistor of the clock driver are equal to the product of the voltage across the transistor and the current through the transistor ($V_{FET} * I_{FET}$). Note that the clock driver conducts during the entire transition of the output clock signal rclk waveform, resulting in continuous energy dissipation as a portion of the current flows through the device contributing to the discharge of the output clock signal rclk node. These losses in the driver are referred to as conduction losses.

Figure 3:
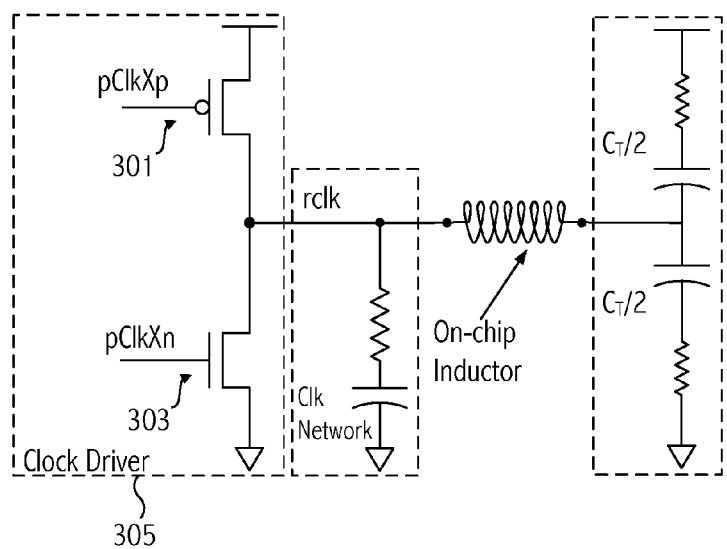
FIG. 3 illustrates a simplified model of an enhanced resonant clocking system referred to as pulse-mode drive, according to some embodiments.
Figure 4:
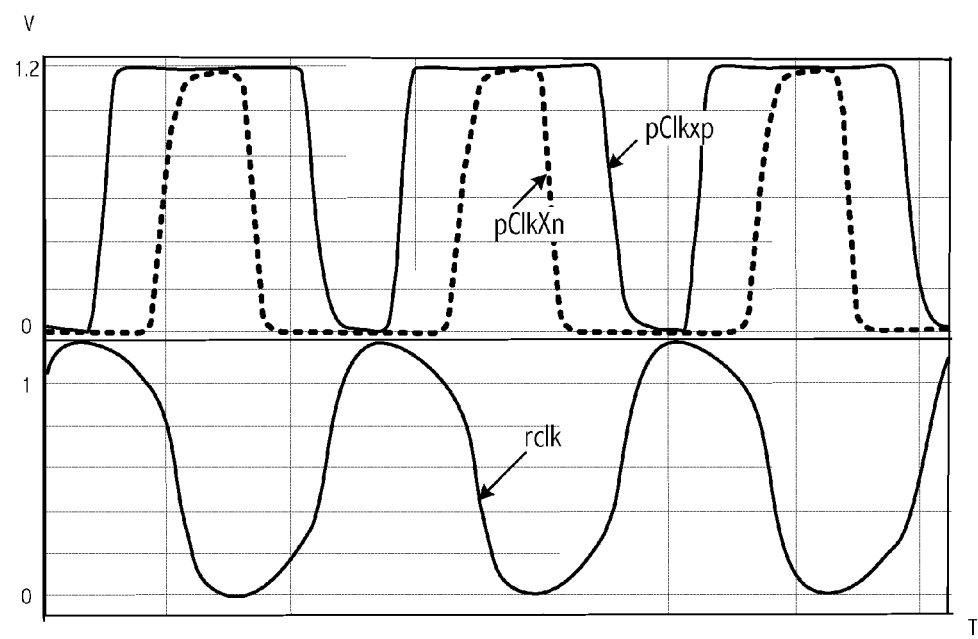
FIG. 4 illustrates waveforms that may be associated with the pulse mode drive of FIG. 3, according to some embodiments.

FIG. 3 shows a simplified model of an enhanced resonant clocking system henceforth referred to as pulse-mode drive, according to some embodiments. The pull-up device 301 and the pull-down device 303 of the clock driver 305 are driven by two separate pulse control signals, pClkXn and pClkXp. FIG. 4 shows the waveforms of pClkXn, pClkXp and the clock signal rclk. Choosing the pulse duty cycle controls the duration for which the devices in the clock driver conduct. Thus, pulse mode drive is able to arrive at a more optimal tradeoff between switching losses (determined by the driver size) and conduction losses (determined by the resistance of the driver and the magnitude of current flowing through it), and in doing so, reduces conduction losses and improves the efficiency of the clock waveform.

Figure 5:
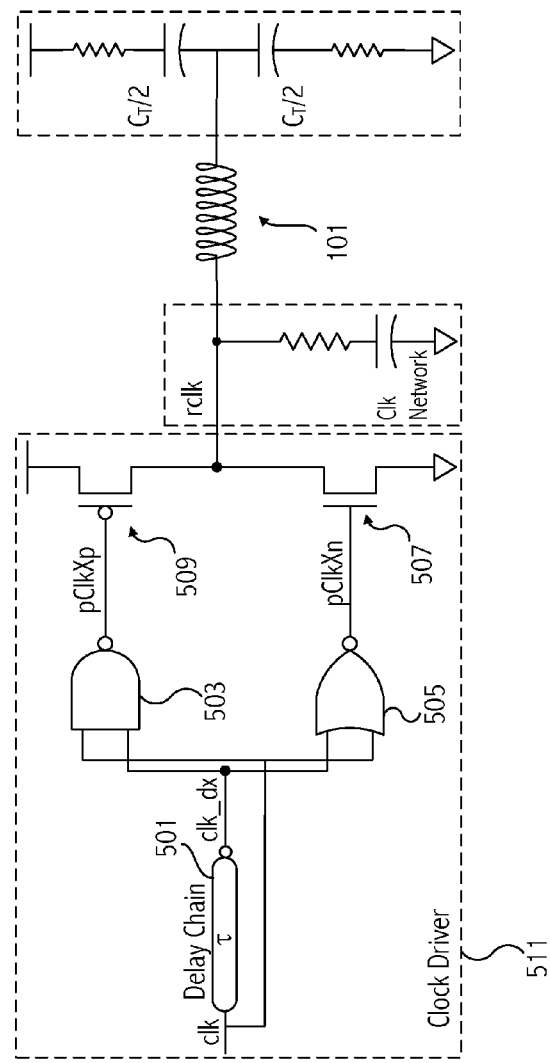
FIG. 5 illustrates an approach for pulse mode drive that uses an inverting delay chain to generate a pulse whose width is equal to the delay through the delay chain, according to some embodiments.

Referring to FIG. 5, the typical approach for pulse mode drive uses an inverting delay chain 501 to generate a pulse whose width is equal to the delay through the delay chain. The signals that drive the final stage of the clock driver, the pulse control signals pClkXp and pClkXn, are generated using a combination of an inverting delay chain 501 and NAND gate 503 and NOR gate 505.

Figure 6:
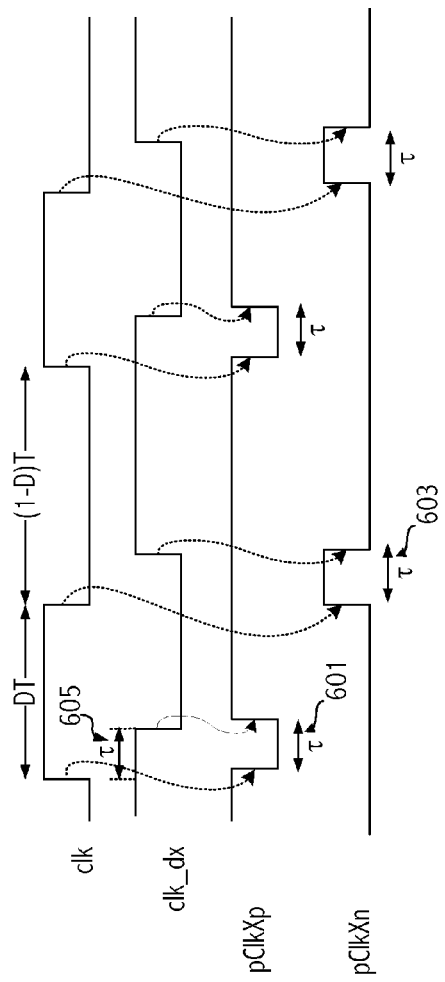
FIG. 6 illustrates a timing diagram associated with the pulse mode drive system shown in FIG. 5, according to some embodiments.

FIG. 6 illustrates a timing diagram associated with the pulse mode drive system shown in FIG. 5. Note that the pulse width 601 and 603 of the signals that drive the final stage of the clock driver are equal to the delay ($\tau$) 605 of the delay chain. Note also that the inverting delay chain output determines the de-asserting edge of the pulse control signals pClkXn and pClkXp (e.g., the falling edge of pulse control signal pClkXn, the rising edge of pulse control signal pClkXp). For example, pulse control signal pClkXn, which drives the NFET device 507 of the clock driver 511, returns to zero due to the rising edge of the clk_dx signal, which is the inverted and delayed version of the clock signal clk. However, the approach of FIG. 5 can cause problems in modern microprocessor systems associated, e.g., with jitter, driver efficiency, process variation, duty cycle, and voltage scaling. Accordingly, improvements in pulse-mode drive control are desirable.

One way to improve the pulse drive system is to change the mechanism by which the delay chain impacts the duty cycle of the pulses that drive the clock driver. As described in more detail herein, some embodiments provide a more effective method for pulse mode drive that enables efficient resonant clock operation, is robust to process variation, supports multi-core supply voltage scaling, and supports clock duty cycle tuning for performance optimization in a microprocessor system.

Figure 7:
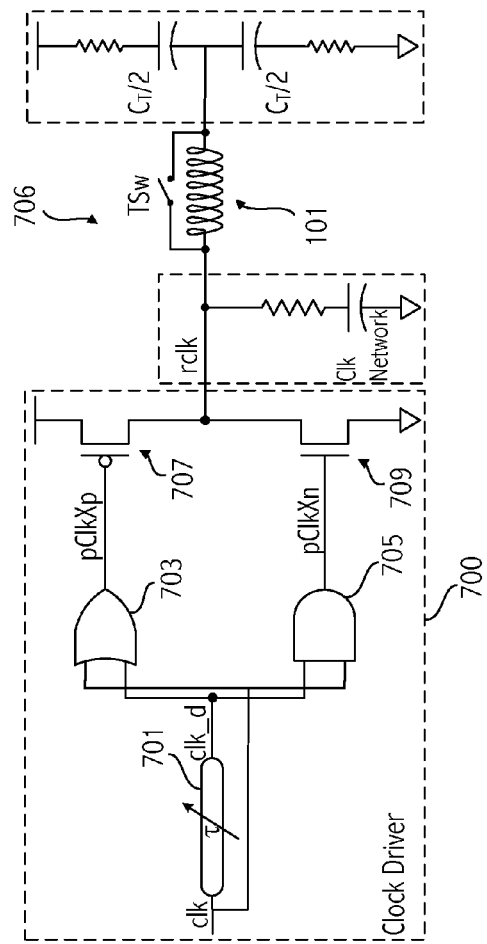
FIG. 7 illustrates a pulse mode drive embodiment that uses a non-inverting delay chain to generate an output pulse having a duty cycle in which the relationship between the input duty cycle and the implemented delay is subtractive, according to some embodiments.
Figure 8:
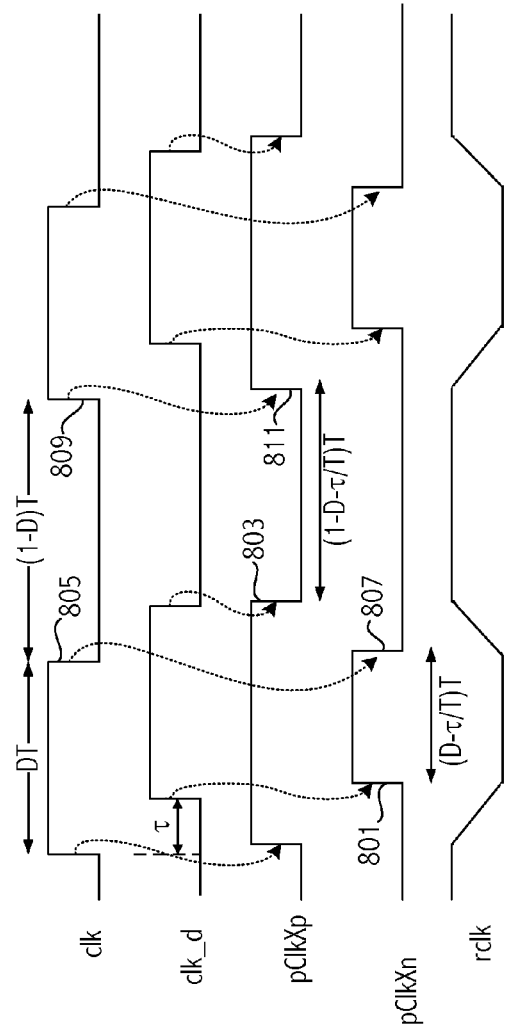
FIG. 8 illustrates a timing diagram associated with the embodiment of FIG. 7, according to some embodiments.

An embodiment of such a system is illustrated in FIG. 7. As shown in FIG. 7, the clock driver 700 uses a non-inverting delay chain 701 along with OR gate 703 and AND gate 705 to implement the pulse control signals pClkXp and pClkXn in FIG. 7, which respectively drive P-channel field effect transistor (pFET) 707 and N-channel field effect transistor (nFET) 709. The clock driver 700 outputs the output clock signal rclk to the resonant clock network 706. As seen from the waveforms of FIG. 8, the relationship between input duty cycle and the implemented delay is subtractive with regards to the generation of the output pulse duty cycle. The clock driver 700 delays asserting the edge of the pulse signals (rising edge of pClkXn for nFET 709, and the falling edge of pClkXp for pFET 707) by an amount of time equal to the delay of the delay chain. Subsequently an edge of the input clock signal "clk" de-asserts the appropriate pulse signal (e.g., the pulse control signals pClkXp or pClkXn). For example, edge 805 of the input clock signal clk causes pulse control signal pClkXn to deassert at 807. Similarly, edge 809 of the input clock signal clk causes the pulse control signal pClkXp to deassert (the rising edge (de-asserting edge) of the PFET pulse control signal pClkXp turns off PFET 707). While the actual circuit implementation of a particular embodiment may vary, the concept is to use the delay element to subtract from the input duty cycle to result in the output duty cycle. Thus, for the pulse control signal pClkXn, the pulse width is (DT−$\tau$). That is, the delay $\tau$ is subtracted from the high portion (DT) of the input clock signal clk. For the pulse control signal pClkXp, the pulse width is (T−DT−$\tau$). That is the delay $\tau$ is subtracted from the low portion (T−DT) of the clock signal clk, where T is the period of the input clock signal clk. Thus, the pulse width of the signals that drive the final stage of the clock driver are equal to the pulse width of the input, minus the delay of the delay chain, i.e., the output duty cycle is a function of input duty cycle, delay-chain delay and cycle time. That is in contrast to the approach illustrated in FIGS. 5 and 6 where the output duty cycle is a function only of the delay chain delay and the cycle time.

In contrast to the pulse drive system illustrated in FIGS. 5 and 6, which uses the delayed clock to control the de-asserting edge of the pulse, the embodiment shown in FIG. 7 uses the delay chain output to determine the asserting edge of the clock (rising signal at the gate terminal at the NFET of the final stage or falling edge at the gate terminal of the PFET of the final stage).

To maintain an efficiently driven, full amplitude clock waveform, the pulse duty cycle typically needs to be in the 30-40% range. A 30-40% duty cycle for the control pulses is desirable for reduced jitter degradation. To obtain the required 30-40% duty cycle range, the delay chain delay implemented in the embodiment of FIG. 7 can be equal to around 10-20% of the duty cycle of the input clock signal clk. In contrast, in the approach of FIG. 5, a pulse whose width is equal to the delay of the delay chain, requires a delay chain that has a delay equal to 30-40% of the duty cycle. Implementing such a delay is more susceptible to process variation, and addressing this susceptibility results in a degradation of the efficiency of the clock drivers. The reduced delay chain delay in the embodiment of FIG. 7 reduces energy dissipation in the driver, which improves the overall energy efficiency of the driver 700 as compared to the approach shown in FIG. 5.

The embodiment illustrated in FIG. 7 has reduced susceptibility to process variation. Using a shorter delay chain, and having the delayed signal determine the asserting edge of the pulse (as opposed to the critical de-asserting edge) reduces the susceptibility of the clock driver signals to process variation. In contrast, maintaining a long delay chain, as in the approach of FIG. 5, to achieve the required duty cycle, and having this delay chain determine the timing of the de-asserting edge of the pulse drive signals that drive the clock driver, results in susceptibility to process variation in the delay chain devices. Clock drivers are typically distributed over the entire processor so multiple delay chains exist. In resonant clocked systems, the de-asserting edge of the clock driver determines the clock transition. Therefore variability between delay chains results in clock skew that degrades system performance. Mitigating susceptibility to process variation requires either using only one or a few delay chains and distributing the delayed clock all over the processor, which is energy inefficient, or designing a process variation tolerant delay chain, which results in significant design complexity.

Modern microprocessors also have to meet phase timing paths arising from the use of dynamic logic or latch-based-designs, which rely on the two phases of the clock to perform computation. A common performance optimization is therefore to vary the duty cycle of the PLL, which propagates to the output of the drivers, and allows for improved performance. The embodiment illustrated in FIG. 7 supports duty cycle modulation. Since the duty cycle of the pulse signals are a function of both the duty cycle of the input clock signal clk, and the delay-chain delay $\tau$, a change in the duty cycle of the input clock signal clk propagates through the clock driver 700 and varies the duty cycle of the output clock signal rclk. By doing so, the embodiment of FIG. 7 supports duty cycle modulation of the phase-locked loop (PLL) clock to improve processor performance, which is not possible with the approach of FIG. 5 since the duty cycle of the pulse control signals pClkXp and pClkXn is a function only of the delay in the delay chain.

Most existing microprocessors use a common power supply plane to power all their cores, so that the voltage that is applied to the cores is determined by the core running at the maximum frequency. Often this implies that a core is made to run at a voltage higher than dictated by its frequency (because some other core is running faster). In the pulse drive system of FIG. 5, however, such a voltage will cause the pulse to shrink and have a detrimental effect on the clock waveform (slew, skew, and amplitude) and therefore performance. That is, the pulse duty cycle of the clock driver signals shrinks with increasing voltage. This is due to the fact that increased voltage shrinks the delay of the delay chain. For a constant clock period, that implies a reduced duty cycle. In contrast, the embodiment of FIG. 7 avoids duty cycle shrinking when the processor core runs at a voltage higher than required for its frequency. Increased voltage reduces the subtractive delay-chain delay, which results in a higher duty cycle. Thus, the duty cycle of the clock driver signals in FIG. 7 increases with increasing voltage. At a higher voltage, the widening pulse drive signals of FIG. 7 may result in possibly wasted energy. However, the clock waveform is guaranteed to be robust, and does not degrade.

While the description has contemplated being used in clock networks of microprocessors, embodiments are not limited to microprocessors. Instead the concepts and advantages described herein apply to integrated circuits in general, where voltage margining is required to ensure robust operation in the field.

While circuits and physical structures have been generally presumed in describing embodiments of the invention, it is well recognized that in modern semiconductor design and fabrication, physical structures and circuits may be embodied in a computer readable medium as data structures for use in subsequent design, simulation, test, or fabrication stages. For example, such data structures may encode a functional description of circuits or systems of circuits. The functionally descriptive data structures may be, e.g., encoded in a register transfer language (RTL), a hardware description language (HDL), in Verilog, or some other language used for design, simulation, and/or test. Data structures corresponding to embodiments described herein may also be encoded in, e.g., Graphic Database System II (GDSII) data, and functionally describe integrated circuit layout and/or information for photomask generation used to manufacture the integrated circuits. Other data structures, containing functionally descriptive aspects of embodiments described herein, may be used for one or more steps of the manufacturing process.

Computer-readable media include tangible computer readable media, e.g., a disk, tape, or other magnetic, optical, or electronic storage medium. In addition to computer-readable medium having encodings thereon of circuits, systems, and methods, the computer readable media may store instructions as well as data that can be used to implement embodiments described herein or portions thereof. The data structures may be utilized by software executing on one or more processors, firmware executing on hardware, or by a combination of software, firmware, and hardware, as part of the design, simulation, test, or fabrication stages.

The description of the invention set forth herein is illustrative, and is not intended to limit the scope of the invention as set forth in the following claims. For example, embodiments of the invention are not limited in scope to microprocessors. Rather, the solution described herein applies to integrated circuits in general, where voltage margining is required to ensure robust operation in the field. Other variations and modifications of the embodiments disclosed herein may be made based on the description set forth herein, without departing from the scope of the invention as set forth in the following claims.

What is claimed is:

1. An apparatus comprising:
    a delay circuit coupled to receive an input clock signal and supply a delayed clock signal;
    a first transistor coupled to receive a first pulse control signal as a first gate signal and supply an output clock node to generate an output clock signal based in part on the first pulse control signal, wherein an asserted edge of the first pulse control signal is responsive to a falling edge of the delayed clock signal; and
    a second transistor coupled to receive a second control signal as a second gate signal and to supply the output clock node to generate the output clock signal based in part on the second control signal, wherein an asserted edge of the second pulse control signal is responsive to a rising edge of the delayed clock signal,
    wherein the first and second pulse control signals are generated independently of the output clock signal; and
    wherein the first pulse control signal is deasserted responsive to a rising edge of the input clock signal and wherein the second pulse control signal is deasserted responsive to a falling edge of the input clock signal.

2. The apparatus as recited in claim 1 wherein a first current carrying terminal of the first transistor is coupled to a first power supply and a second current carrying terminal of the first transistor is coupled to the output clock node.

3. The apparatus as recited in claim 2 wherein a first carrying terminal of the second transistor is coupled to a second power supply and a second current carrying terminal of the second transistor is coupled to the output clock node.

4. The apparatus as recited in claim 1 wherein the first transistor is a p-channel field effect transistor (pFET) coupled between the output clock node and VDD and the second transistor is an n-channel field effect transistor (nFET) coupled between the output clock node and ground.

5. The apparatus as recited in claim 1 further comprising a resonant clock network coupled to receive the output clock signal.

6. The apparatus as recited in claim 1, wherein the delay circuit provides a delay of approximately ten to twenty percent of a period of the input clock signal.

7. The apparatus as recited in claim 1, wherein the first and second pulse control signals have a duty cycle of approximately 30 to 40 percent of a period of the input clock signal.

8. The apparatus as recited in claim 1 further comprising:
    an OR gate coupled to receive the input clock signal and the delayed clock signal and supply the first pulse control signal; and
    an AND gate coupled to receive the input clock signal and the delayed clock signal and supply the second pulse control signal.

9. The apparatus as recited in claim 1 wherein a delay between the input clock signal and the delayed clock signal is used to generate the first and second pulse control signals.

10. A method comprising:
    delaying an input clock signal in a delay circuit and supplying a delayed clock signal;
    logically ORing the input clock signal and the delayed clock signal to generate a first pulse control signal, the first pulse control signal being asserted responsive to a falling edge of the delayed clock signal;

supplying the first pulse control signal to a first transistor as a first gate signal;

asserting a second pulse control signal responsive to a rising edge of the delayed clock signal; and supplying the second pulse control signal to a second transistor as a second gate signal.

11. The method as recited in claim 10 further comprising supplying a clock output signal node from the first transistor according to the first pulse control signal.

12. The method as recited in claim 11 further comprising supplying the clock output signal node from the second transistor according to the second pulse control signal.

13. The method as recited in claim 12 wherein the first transistor is a p-channel transistor coupled between the output clock node and VDD and the second transistor is an n-channel transistor coupled between the output clock node and ground.

14. The method as recited in claim 12 further comprising supplying a resonant clock network with a resonant clock signal from the clock output signal node.

15. The method as recited in claim 10, further comprising providing a delay in the delay circuit of approximately ten to twenty percent of a period of the input clock signal.

16. The method as recited in claim 10 further comprising logically ANDing the input clock signal and the delayed clock signal to generate the second pulse control signal.

17. The method as recited in claim 10 further comprising using a delay between the input clock signal and the delayed clock signal to generate the first and second pulse control signals.

18. A non-transitory computer-readable medium storing a computer readable data structure encoding a functional description of an integrated circuit, the integrated circuit comprising:

a resonant clock network;

a delay circuit coupled to receive an input clock signal and supply a delayed clock signal;

a first transistor coupled to receive a first control signal as a first gate signal and supply an output clock node, wherein an asserted edge of the first control signal is responsive to a falling edge of the delayed clock signal; and a second transistor coupled to receive a second control signal as a second gate signal and to supply the output clock node, wherein an asserted edge of the second control signal is responsive to a rising edge of the delayed clock signal;

wherein a first carrying terminal of the first transistor is coupled to a first power supply and a second current carrying terminal of the first transistor is coupled to a clock output signal node;

wherein a first carrying terminal of the second transistor is coupled to a second power supply and a second current carrying terminal of the second transistor is coupled to the clock output signal node; and wherein the first control signal is generated as a first logical combination of the input clock signal and the delayed clock signal and the second control signal is generated as a second logical combination of the input clock signal and the delayed clock signal;

wherein the first control signal is deasserted responsive to a rising edge of the input clock signal and wherein the second control signal is deasserted responsive to a falling edge of the input clock signal.

19. The computer-readable medium as recited in claim 18 wherein the resonant clock network is coupled to receive an output clock signal from the output clock node.

* * * * *